United States Patent [19]

St. John et al.

[11] Patent Number: 4,595,606

[45] Date of Patent: Jun. 17, 1986

[54] SOLDERABLE CONDUCTIVE COMPOSITIONS HAVING HIGH ADHESIVE STRENGTH

[75] Inventors: Frank St. John, Patterson; Samson Shahbazi, Yonkers, both of N.Y.

[73] Assignee: Rohm and Haas Company, Philadelphia, Pa.

[21] Appl. No.: 631,974

[22] Filed: Jul. 18, 1984

[51] Int. Cl.$^4$ ............................ B05D 5/12; H01B 1/02
[52] U.S. Cl. ....................................... 427/96; 427/282; 427/393.5; 427/393.6; 252/514; 524/440; 428/901
[58] Field of Search ................ 252/514; 524/439, 500, 524/501; 523/457, 459; 428/901; 427/96, 282, 393.5, 396.3

[56] References Cited

U.S. PATENT DOCUMENTS

| | | | |
|---|---|---|---|
| 3,412,043 | 11/1968 | Gelliland | 252/514 |
| 3,666,689 | 5/1972 | Groszek et al. | 252/514 |
| 4,371,459 | 2/1983 | Nazarenko | 252/514 |
| 4,410,457 | 10/1983 | Fujimura et al. | 252/514 |

FOREIGN PATENT DOCUMENTS 3102930 2/1977 Japan .

*Primary Examiner*—Josephine L. Barr
*Attorney, Agent, or Firm*—Carl W. Battle; W. E. R. Scott; Michael B. Fein

[57] ABSTRACT

This invention provides conductive compositions that are directly solderable and that can be bonded directly to substrates. The compositions are made of silver exclusively in the form of flake and a resin system, said resin system comprising phenolic resin, acrylic resin, polyurethane resin, vinyl chloride/vinyl acetate copolymer, epoxy resin and epoxy hardner. By making a mixture of such a complex vehicle system a composition is produced that displays outstanding solderability and adhesion. Also provided is a method of making these compositions.

11 Claims, No Drawings

SOLDERABLE CONDUCTIVE COMPOSITIONS HAVING HIGH ADHESIVE STRENGTH

BACKGROUND OF THE INVENTION

1. Field of the Invention

This invention relates to conductive compositions that may be used on electronic applications such as electrical circuits on printed circuit boards. More particularly this invention relates to conductive compositions which are directly solderable and which can be bonded directly to substrates.

2. Description of Prior Art

An electrically conductive composition applied to a supporting or base structure must be sufficiently conductive to carry electric current and must be firmly adhered or bonded to the support or base. Furthermore, it is desirable that the conductive composition be directly solderable.

U.S. Pat. No. 3,030,237 discloses an improved coating material essentially comprised of organic resin carrier and a suitable metallic pigment. The invention lies in the discovery that a coating having a metallic pigment component consisting of a mixture of ball and flake particles, having particular dimensions and used in certain proportions, in combination with an organic resin carrier, can exhibit good adhesion and electrical conductivity. Also disclosed is that conventional wire leads may be silver soldered to the cured coating using entirely common silver soldering techniques.

U.S. Pat. No. 2,959,498 discloses a method of forming conductive silver circuits by first applying to a resinous dielectric surface a layer of an incompletely cured thermosetting resin, and then applying on said layer, in the outline of the desired conductive circuit, a layer of finely divided silver admixed with a thermoplastic resin containing a solvent for both of said resins, and then heating to cure both layers of applied resins. It is essential that the resinous panel first be coated with a thermosetting resin and that this resin is only partially cured before application of the conductive composition. The conductive circuit is applied over the undercoating, preferably by squeezing a silver paste in the desired electrical circuit pattern. The particles in a thermoplastic resin in a ratio of between 4:1 and 10:1 silver to resin. The resulting silver circuit pattern will be firmly adhered to the resinous substrate and the silver lines will readily accept solder.

U.S. Pat. No. 4,371,459 discloses screen printable conductor composition that is flexible comprising (a) a conductive phase containing silver and base metal powders dispersed in a solution of (b) a multipolymer prepared by copolymerization of vinyl acetate, vinyl chloride, and an ethylenically unsaturated dicarboxylic acid and a linear aromatic polyester resin dissolved in (c) volatile nonhydrocarbon solvent. These compositions are particularly useful for application to membrane touch switches.

U.S. patent application Ser. No. 537,740 filed Sept. 30, 1983, now U.S. Pat. No. 4,564,563 discloses a solderable electrically conductive composition comprising metallic silver particles embedded in a matrix formed from acrylic, carboxylated vinyl and an epoxy. The composition is formed by dissolving acrylic powder and vinyl powder in respective solvents to form a first solution and a second solution. The solutions are then mixed with metallic silver particles and an epoxy to form an ink which is applied to a substrate to form a film thereon. The film is cured to evaporate the solvents and allow polymerization to occur thereby having a solderable electrically conductive film.

Heretofore, conductive compositions developed for use in connection with supporting or base structures or other electrical equipment have been characterized by unacceptably high electrical resistivity or unacceptably low adhesion to the supporting or base material. Furthermore, many prior art compositions suffer from the deficiency of not being directly solderable; that is, the time consuming and expensive process of electroless plating or the like must be employed in order to apply solder to the conductive composition. The compositions that are capable of being soldered either are not solderable by a variety of soldering techniques or do not accept the solder very well. Additionally, many of the prior art compositions cannot be bonded directly to the substrate on which they are applied.

While some prior art compositions do solve some of these deficiencies they are deficient in that complicated formulations employing additional compounds must be used and additional processing steps must be conducted. Furthermore, none of the prior art compounds exhibit the characteristics of sufficient conductivity, and solderability while at the same time being capable of direct bonding to substrates with outstanding adhesion resulting. Additionally, the prior art compounds must be cured at very high temperatures which places great energy demands on the process and adds to processing complications.

It has been a long sought goal to provide conductive compositions that have good conductivity, are directly solderable without having to resort to the need for complicated procedures or formulations and which can be bonded directly to substrates with a high degree of adhesion resulting.

SUMMARY OF THE INVENTION

It is therefore an object of the invention to provide conductive compositions that are directly solderable and which can be bonded directly to substrates.

It is another object to provide conductive compositions that are directly solderable using a variety of methods such as, for example, dipp, reflow and wave soldering techniques.

It is still another object to provide compositions with excellent conductivity characteristics.

It is a further object to provide conductive compositions with outstanding reflow solderability and high adhesion to the substrate on which they are applied.

It is still a further object to provide compositions that have good solder wetability.

It is another object to provide compositions that can be cured at low temperatures.

It is yet another object to provide a method for making these compositions.

These objects and others that will become apparent, are achieved by the present invention, which comprises, in one aspect, a directly solderable conductive composition comprising silver exclusively in the form of flake and a resin system, said resin system comprising phenolic resin, acrylic resin, polyurethane resin, vinyl chloride/vinyl acetate copolymer, epoxy resin and epoxy hardner. Another aspect of the invention is a method of making a directly solderable conductive composition comprising substantially dissolving phenolic resin, acrylic resin, polyurethane resin, epoxy resin and epoxy hardner in ester solvent to form a first solution, dissolving vinyl chloride/vinyl acetate copolymer in ketone solvent to form a second solution and mixing the first and second solutions with silver flake to form a mixture such that the silver flake is substantially dispersed and wetted. Yet another aspect of the invention is a method of applying a conductive composition to a substrate comprising bonding the conductive composition directly to the substrate.

DETAILED DESCRIPTION OF THE INVENTION

The compositions of this invention comprise silver exclusively in the form of flake and a resin system, said resin system comprising phenolic resin, acrylic resin, polyurethane resin, vinyl chloride/vinyl acetate copolymer, epoxy resin and epoxy hardner. In practice the silver flake is distributed throughout the resin system. The resin system not only holds the silver flake in suspension but also provides adhesion of the silver flake to a substrate, holds ths silver flake together such that a conductive path is formed and provides flexibility. Furthermore, on curing the resin pulls away from the silver towards the substrate thus leaving a highly enriched silver layer on top.

The compositions of the instant invention are applied to substrates while in the liquid state, that is, the compositions are mixed with a solvent which acts as a vehicle. Once applied to the substrate the composition is cured and the solvent evaporates leaving a dried, cured composition that contains only traces of solvent. In the following discussion, ratios of certain elements employed will be disclosed; it is important to point out that these ratios relate to the composition in its dried and cured state, not to the composition in its liquid state during the process of manufacture, that is, when containing a solvent, unless otherwise indicated.

It is important to note that for the purpose of this invention the silver employed must be 100% silver flake. Silver in other forms such as, for example, ball or mixtures of ball and flake will not lead to the production of a composition that demonstrates all of the advantages of the compositions produced according to the instant invention. We consider a particle to be in flake form when the distance across the particle is at least five times greater than the particle is thick. Preferably, the particle should be ten times greater across than it is thick. The presence of only silver flake has a further advantage in that it (the silver flake) seems to contribute to reducing or elimnating silver migration problems seen in the prior art compositions. The average particle size of the silver flake may be from about 0.5 microns to 50 microns, preferably in the range of about 2 microns to about 4 microns. It is understood that silver flake particles may be present having a particle size of less than 0.5 microns or more than 50 microns; as long as the average particle size of the silver flake is between 0.5 microns and 50 microns, the compositions of the invention can be prepared. If the average particle size of the silver flake is less than 0.5 microns, there will be difficulty in getting the compositions to load this quanitity of silver. If the silver is too fine, the consistancy of the composition will be too clay-like. If the average particle size of the silver flake is above about 50 microns, then the composition will be very difficult to apply. For example, the composition will tend to clog up during a screening process or the like. The cured compositions of the invention contain between about 88% and 93%, by weight, silver flake.

The vinyl chloride/vinyl acetate used has a number average molecular weight range of between about 14,000 and 35,000. Preferably, the number average molecular weight of the copolymer is about 20,000. The higher molecular weight vinyl chloride/vinyl acetate copolymer has better durability and toughness characteristics than the lower molecular weight vinyl chloride/vinyl acetate copolymers. We have found that other types of vinyl acetate/vinyl chloride copolymers do not function as the vinyl chloride/vinyl acetate copolymer does of the instant invention. E. I. DuPont de Nemours sells a carboxyl modified vinyl chloride/vinyl acetate copolymer designated V.M.C.C. This product has a weight ratio of vinyl chloride to vinyl acetate to maleic acid of 83:16:1. Compositions made with this product deteriorate as soon as solder is applied. Apparently, the presence of the dicarboxylic acid is detrimental to the end uses disclosed in this invention. A polyvinyl buterol was also tried. This is a modified polyvinyl alcohol. The composition made with this resin also disintegrated as soon as solder was applied. The compositions of the instant invention require a high performance vinyl-chloride/vinyl acetate copolymer; low molecular weight or modified vinyl chloride/vinyl acetate copolymers do not work. The weight ratio of vinyl chloride to vinyl acetate can be from about 80:20 to about 90:10. Preferably, the weight ratio is from about 86:16 to about 88:12. The vinyl chloride/vinyl acetate copolymer having a number average molecular weight of 35,000 had a weight ratio of vinyl chloride to vinyl acetate of about 90:10; the vinyl chloride/vinyl acetate copolymer having a number average molecular weight of 14,000 had a weight ratio of vinyl chloride to vinyl acetate of about 86:14.

Although the examples contained in this specification were all carried out by a vinyl chloride/vinyl acetate copolymer designed VYHH supplied by Union Carbide, other types of vinyl chloride/vinyl acetate copolymer may be employed as long as the copolymer conforms to the specifications hereinbefore described.

The epoxy resin employed as part of the resin system can be any type of epoxy resin that is commercially available and that conforms to the the following specifications. We have used an epoxy resin sold by Ciba Geigy designated Araldite ® 6010. This is an unmodified liquid of medium viscosity which is based on bisphenol A and epichlorohydrin. The epoxy hardner employed is also supplied by Ciba Geigy and designated HY940. The purpose of the epoxy hardner is to crosslink with the epoxy resin to form a solid under curing conditions; the epoxy resin and epoxy hardner employed must not crosslink at room temperature. It must be a one step heat curable system and be compatible with the other ingredients such as the solvent. The final stipulation is that the epoxy resin can't be a water based epoxy resin.

The phenolic resin used was a one step heat curing long chain solid phenolic resin sold by Reichhold Chemical Company under the trade name Varcum 29-112. Any similar type of phenolic resin may be used as long as it does not crosslink at room temperature. The number average molecular weight of the resin should be greater than 400 and less than 1000. Of course it must also be soluble in ester solvent.

The acrylic resin used was a solid acrylic resin sold by Rohm and Haas Company under the trade designation Acryloid ® B-66. Any acrylic resin 1may be employed as long as it is soluble in ester solvent.

The polyurethane resin used was obtained from B. F. Goodrich Comany. It is sold under the trade designation Estane ® 5702 and has a glass transition temperature of from −10° C. to −50° C. Other polyurethane resins having a glass transition temperature within this range may be used.

The ratio used of silver flake to resin system is important. If these elements are not used within the ranges of ratios specified, the compositions produced will not possess all of the characteristics hereinbefore described. In the broadest sense, the weight ratio of silver flake to resin system should be from about 75:25 to about 90:10 and preferably from about 80:20 to about 85:15.

Within the resin system the ratio of epoxy resin to epoxy hardner should be from about 45:55 to about 30:70.

The compositions of this invention should have silver flake present in an amount of from about 80% to about 85%, by weight, of the total composition, the phenolic resin present in an amount of from about 0.6% to about 1.6% by weight, of the total composition, the polyurethane resin present in an amount of from about 0.4% to about 0.8%, by weight, of the total composition, the acrylic resin present in an amount of from about 0.8% to about 1.6%, by weight, of the total composition, the vinyl chloride/vinyl acetate copolymer present in an amount of from about 1.2% to about 3.5% by weight, of the total composition, the epoxy resin present in an amount of from about 1.0% to about 3.0% by weight, of the total composition and the epoxy hardner present in an amount of about 2.5% to about 4.0%, by weight, of the total composition.

An advantage of the compositions of the instant invention is that they are directly solderable. This means that they accept solder directly without the engineer having to resort to the use of time consuming and expensive procedures such as electroless plating. The compositions can be soldered by any one of a number of methods such as, for example, dip or reflow soldering techniques as long as the solder temperature does not exceed 205° C. Of course, the need for the use of a solder flux is not obviated by the compositions of the instant invention. Solder flux is a resin based material that aids the wetability of compositions. Solder flux is nonconductive, is widely used and is generally a liquid. The flux can be applied in a variety of ways. Pre-fluxing can be employed wherein the composition to be soldered is first dipped into liquid flux and then the solder is applied when the composition is still wet. Alternatively, the flux can be a component of a solder-alloy mixture. In this case, the vehicle is the flux and pre-fluxing is not required. Additionally, the flux may also be activated or not activated. Activated flux cleans the surface to be soldered.

As previoulsy indicated the compositions of the invention are applied to substrates in liquid form and are then cured. The compositions of the invention can be applied to a variety of substrates that may be made from a variety of materials. Specifically, the substrates must be ceramic or resinous in nature. An example of a typical substrate is a printed circuit board. The only limitation on the substrate is that it must be able to withstand the conditions of the solder both without being deformed or destroyed.

The compositions of this invention are made by substantially dissolving phenolic resin, acrylic resin, polyurethane resin, epoxy resin, epoxy hardner in ester solvent to form a first solution, dissolving vinyl chloride/vinyl acetate copolymer in ketone solvent to form a second solution and mixing the first and second solutions with silver flake to form a mixture such that the silver flake is substantially wetted and dispersed. The ratio of the silver flake to the first solution to the second solution is from about 65:20:15 to about 80:10:10. The ratio of total resin to solvent in the first solution is from about 1:1 to about 1:2 and the ratio of total resin to solvent in the second solution is from about 3:1 to about 9:1.

With respect to the total mixture the silver flake is present in an amount of from about 65% to about 80%, by weight, of the total composition, the first solution is present in an amount of from about 10% to about 20%, by weight, of the total composition and the second solution is present in an amount of from about 10% to about 15%, by weight, of the total composition.

There are no special techniques required in carrying out the method of this invention other than the phenolic, acrylic, polyurethane and epoxy hardners must be substantially dissolved in an ester solvent and the vinyl chloride/vinyl acetate copolymer must be dissolved in a ketone solvent. The silver flake may be added by any conventional technique. The ketone solvent may be any ketone solvent such as, for example, gamma butyrolactone, acetone or cyclohexane or the like. The ester solvent can be any ester solvent such as, for example, butyl Carbitol ® acetate or the like; butyl Carbitol ® acetate is an ester solvent supplied by Union Carbide.

Prior to the application of the composition to a substrate, the fineness of grind must be checked and found to be 25 microns or less. Fineness of grind can be checked using any standard technique employing a fineness of grind gauge. If the fineness of grind is not 25 microns or less, then the composition should be passed through a 3 roll mill until the proper fineness of grind is obtained. Using feeler guages, the roll gaps should be set as follows: 0.002" gap between the apron roll and middle role and 0.015" gap between the middle roll and back roll. The composition should not be passed through the 3 roll mill more than three times. Additionally, the viscosity of the composition should range from about 30,000 c.p.s. to about 100,000 c.p.s. at 25° C. when measured using a standard Brookfield viscometer. Preferably, the viscosity is between about 30,000 c.p.s. and 70,000 c.p.s.

The mixture so formed can be applied to a substrate by any one of a number of techniques such as by silk screening, spraying, brushing. The substrate may be flexible or rigid and may be of a variety of types such as resinous or ceramic. Typical examples of substrates are printed circuit boards. The mixture can be applied at a thickness of 1 mil or more. Once applied to the substrate, the mixture is dired and cured at a temperature of from about 100° C. to about 170° C. for about 15 to about 60 minutes. The drying and curing can be carried out by any of a number of techniques such as baking in an oven.

The compositions of this invention may be bonded directly to substrates. The method is simply applying a conductive composition onto a substrate comprising bonding the conductive composition comprising silver exclusively in the form of flake and a resin system comprising phenolic resin, acrylic resin, polyurethane resin, vinyl chloride/vinyl acetate copolymer, epoxy resin, and epoxy hardner directly to the substrate. The substrate does not need to have been precoated or pretreated with any composition or by any process. Once dried and cured the compositions demonstrate excellent adhesion to the substrate. The average force required to remove the composition from a rigid substrate is greater than 1000 p.s.i.

In measuring the force required to remove (or destroy) the composition from a rigid substrate, a pad of compositional material is coated on the substrate one tenth of an inch square. This pad is then soldered. A 22 gauge tin coated copper wire is then soldered into the pad perpendicular to the substrate. The force required to tear the pad off of the substrate is then measured by conventional means. Any failure is in the ability of the pad to adhere to the substrate, not in the wire adhering to the pad. Any removal of the composition or deterioration of the composition is considered a failure.

In order that those skilled in the art will better be able to practice the invention, the following examples are given by way of illustration, and not by way of limitation.

EXAMPLES

EXAMPLE I

Method of Making the Composition

The following ingredients were mixed together and dissolved in 83.3 grams butyl Carbitol® acetate to make a first solution:

16.6 grams varcum 29-112
14.3 grams acryloid B-66
9.0 grams Estane® 5702
47.5 grams Araldite® 6010
29.4 grams epoxy hardner—HY940
20 grams of vinyl chloride/vinyl acetate copolymer having a number average molecular weight of 20,000 was dissolved in 80 grams of gamma butyerolactone to form a second solution.

The two solutions were then mixed together with 700 grams of silver having an average particle size of 23 microns. The silver flakes were blended into the solution so that the flakes were wetted and dispersed.

The fineness of grind of this mixture was checked and found to be 23 microns.

The resultant mixture was applied to a printed circuit board by silk screening and then cured for 30 minutes at 165° C.

We claim:

1. A directly solderable conductive composition consisting essentially of, in combination, from about 80% to about 85% by weight silver and a resin system consisting essentially of from about 0.6% to about 1.6% by weight phenolic resin, from about 0.8% to about 1.6% by weight acrylic resin, from about 0.4% to about 0.8% by weight polyurethane resin, from about 1.2% to about 3.5% by weight vinyl chloride/vinyl acetate copolymer, from about 1.0% to about 3.0% by weight epoxy resin and from about 2.5% to about 4.0% by weight epoxy hardener; said silver being 100% in the form of flake having an average particle size from about 0.5 to about 50 microns, and said vinyl chloride/vinyl acetate copolymer having a number average molecular weight from about 14,000 to about 35,000 and containing no carboxylic acid groups.

2. The composition of claim 1 wherein the ratio of vinyl chloride to vinyl acetate is from about 80:20 to about 90:10.

3. The method of claim 1 wherein the ratio of silver flake to the first solution to the second solution is from about 65:20:15 to about 80:10:10.

4. The method of claim 1 wherein the ratio of total resin to solvent in the first solution is from about 1:1 to about 1:2 and the ratio of total resin to solvent in the second solution is from about 3:1 to about 9:1.

5. The method of claim 1 wherein the silver flake is present in an amount of from about 65% to about 80%, by weight, of the total composition, the first solution is present in an amount of from about 10% to about 20%, by weight, of the total composition and the second solution is present in an amount of from about 10% to about 15%, by weight, of the total composition.

6. The method of claim 1 additionally comprising applying the mixture to a substrate, then drying and curing the mixture.

7. The method of claim 6 wherein the substrate is a printed circuit board.

8. The method of claim 6 wherein the mixture is dried and cured at a temperature of from about 125° C. to about 180° C. for about 15 minutes to about 120 minutes.

9. A method of applying a conductive composition to a substrate comprising bonding the conductive composition of claim 1 directly to the substrate.

10. The method of claim 9 wherein the force required to remove the conductive composition from the substrate is greater than 1000 p.s.i.

11. The method of claim 9 wherein the substrate is a printed circuit board.

* * * * *

UNITED STATES PATENT AND TRADEMARK OFFICE
CERTIFICATE OF CORRECTION

PATENT NO. : 4,595,606

DATED : June 17, 1986

INVENTOR(S) : Frank St. John and Samson Shahbazi

It is certified that error appears in the above-identified patent and that said Letters Patent is hereby corrected as shown below:

Column 8:

Add new claim 3 to read as follows: "A method of making a composition of claim 1 comprising mixing said phenolic resin, acrylic resin, polyurethane resin, epoxy resin and epoxy hardner in an ester solvent to form a first solution, dissolving said vinyl chloride/vinyl acetate copolymer in ketone solvent to form a second solution and mixing the first and second solutions with said silver flake to form a mixture."

Column 8:

Renumber claim 3 as "claim 4" and change "claim 1" therein to "claim 3".

Renumber claim 4 as "claim 5" and change "claim 1" therein to "claim 3".

Renumber claim 5 as "claim 6" and change "claim 1" therein to "claim 3".

Renumber claim 6 as "claim 7" and change claim 1" therein to "claim 3".

Renumber claim 7 as "claim 8" and change claim 6" therein to "claim 7".

UNITED STATES PATENT AND TRADEMARK OFFICE
CERTIFICATE OF CORRECTION

PATENT NO. : 4,595,606
DATED : June 17, 1986
INVENTOR(S) : Frank St. John and Samson Shahbazi It is certified that error appears in the above-identified patent and that said Letters Patent is hereby corrected as shown below:

Column 8:

Renumber claim 8 as "claim 9" and change "claim 6" therein to "claim 7".

Renumber claim 9 as "claim 10".

Renumber claim 10 as "claim 11" and change "claim 9" therein to "claim 10".

Renumber claim 11 as "claim 12" and change "claim 9" therein to "claim 10".

Signed and Sealed this

Seventh Day of September, 1993

Attest:

BRUCE LEHMAN

*Attesting Officer*　　*Commissioner of Patents and Trademarks*